(12) United States Patent
Ushiro et al.

(10) Patent No.: US 10,714,234 B2
(45) Date of Patent: Jul. 14, 2020

(54) CABLE DISCONNECTION PREVENTING STRUCTURE

(71) Applicant: OMRON Corporation, Kyoto (JP)

(72) Inventors: Yuki Ushiro, Ayabe (JP); Naomi Uehara, Ayabe (JP); Motoharu Okuno, Fukuchiyama (JP); Hiroyuki Mizusaki, Fukuchiyama (JP)

(73) Assignee: OMRON Corporation, Kyoto (JP)

( * ) Notice: Subject to any disclaimer, the term of this patent is extended or adjusted under 35 U.S.C. 154(b) by 371 days.

(21) Appl. No.: 15/842,904

(22) Filed: Dec. 15, 2017

(65) Prior Publication Data

US 2018/0268960 A1 Sep. 20, 2018

(30) Foreign Application Priority Data

Mar. 14, 2017 (JP) .................................. 2017-048226

(51) Int. Cl.
*H01B 7/18* (2006.01)
*G01J 1/02* (2006.01)
*H02G 15/007* (2006.01)

(52) U.S. Cl.
CPC .......... *H01B 7/1805* (2013.01); *G01J 1/0219* (2013.01); *H02G 15/007* (2013.01)

(58) Field of Classification Search
CPC .......... H05K 5/0247; H05K 5/00; H05K 5/02; H05K 5/0208; H05K 5/0217; H01R 13/56; H01R 13/46; H01R 13/58; H02G 15/007; H02G 15/00; H02G 15/04; H01B 7/1805; H01B 7/17; H01B 7/18; G01J 1/0219

USPC .......... 174/662, 663, 68.1, 68.3, 72 A, 74 R, 174/153 G, 152 G; 439/449, 445, 447; 248/49, 68.1
See application file for complete search history.

(56) References Cited

U.S. PATENT DOCUMENTS

| | | | | |
|---|---|---|---|---|
| 4,724,282 A | * | 2/1988 | Troder | H02G 3/083 174/661 |
| 6,875,918 B2 | * | 4/2005 | Sudo | H02G 3/0468 138/108 |
| 7,132,602 B1 | * | 11/2006 | Komiya | H02G 11/006 174/70 R |

(Continued)

FOREIGN PATENT DOCUMENTS

| | | |
|---|---|---|
| CN | 1677450 | 10/2005 |
| CN | 101567509 | 10/2009 |

(Continued)

OTHER PUBLICATIONS

"Office Action of China Counterpart Application," dated Jun. 25, 2019, with English translation thereof, p. 1-p. 11.

*Primary Examiner* — Angel R Estrada
(74) *Attorney, Agent, or Firm* — JCIPRNET

(57) ABSTRACT

Provided is a cable disconnection preventing structure or the like in which a conducting wire is not cut at a connecting portion at which a distal end of a conducting wire is connected to a substrate or the like even when a cable is pulled. The cable disconnection preventing structure (100) comprises a case (30) and a conducting wire fixing member (20) which fixes a conducting wire (2) exposed from a sheath (1) to the sheath (1) at one end portion of the cable (10). The conducting wire (2) is disposed between an inner surface (31) around the cable hole (30*a*) and the conducting wire fixing member (20).

10 Claims, 4 Drawing Sheets

(56) References Cited

U.S. PATENT DOCUMENTS

| | | | | |
|---|---|---|---|---|
| 8,878,069 | B2* | 11/2014 | Kim | B60R 16/0215 |
| | | | | 174/664 |
| 9,699,927 | B2* | 7/2017 | Takahashi | H05K 5/0247 |
| 2008/0164059 | A1 | 7/2008 | Cipolla | |
| 2015/0138785 | A1* | 5/2015 | Oksengendler | H05K 5/0217 |
| | | | | 174/535 |

FOREIGN PATENT DOCUMENTS

| | | |
|---|---|---|
| CN | 102570141 | 7/2012 |
| CN | 104577889 | 4/2015 |
| JP | 2003243849 | 8/2003 |
| JP | 4575698 | 11/2010 |
| JP | 2013041739 | 2/2013 |
| WO | 2015106996 | 7/2015 |

* cited by examiner

CABLE DISCONNECTION PREVENTING STRUCTURE

CROSS-REFERENCE TO RELATED APPLICATION

This application claims the priority benefit of Japanese application serial no. 2017-048226, filed on Mar. 14, 2017. The entirety of the above-mentioned patent application is hereby incorporated by reference herein and made a part of this specification.

BACKGROUND

Technical Field

The disclosure relates to a cable disconnection preventing structure.

Description of Related Art

In order to prevent excessive movement of a cable connected to a sensor device or the like, a cable disconnection preventing structure in which an adhesive is applied to a sheath, an inner coat, or the like of a cable or a molded body is formed around the cable has been developed.

For example, Patent Document 1 discloses a cord locking structure which locks a cord formed by covering an outer peripheral surface of a core wire with an insulator and a sheath material in this order to a case hole, and in which a metal part is caulked to the sheath material and a bushing for fixing the case hole and the cord is provided in the caulked portion of the metal part.

In addition, Patent Document 2 discloses a molded body attached to a cable extraction hole of a housing which covers a first exposed region in which an insulating film is exposed by peeling a sheath at a distal end portion connected to an electronic component of a cable and the sheath remaining at the end portion, and covers a region in which a stranded wire is exposed by peeling the insulating film at a position different from the region connected to the electronic component in the first exposed region and the insulating film remaining on both end sides thereof.

[Patent Document 1] Japanese Unexamined Patent Application Publication No 2003-243849 (Publication Date: Aug. 29, 2003)

[Patent Document 2] Japanese Unexamined Patent Application Publication No 2013-041739 (Publication Date: Feb. 28, 2013)

However, in the technology described in Patent Document 1, only a portion of a sheath of a cable is fixed, and a conducting wire in the sheath is not fixed. Therefore, when the cable is pulled, the conducting wire is also pulled together with the cable. As a result, the conducting wire may be cut at a connecting portion at which a distal end of the conducting wire is connected to a substrate or the like, and the conductors in the conducting wires may come into contact with each other, resulting in a short circuit.

Further, in the technology described in Patent Document 2, although the conducting wire in the sheath is resin-sealed with a molded body, with only the resin sealing of the conducting wire, there are cases in which the conducting wire cannot be completely fixed when the cable is pulled. Therefore, the same problem as described above may occur.

SUMMARY

A cable disconnection preventing structure according to one or some exemplary embodiments of the invention includes a case which has a cable hole through which a cable having a plurality of conducting wires covered with a sheath passes and in which one end portion of the cable is embedded, and a conducting wire fixing member which fixes the conducting wires exposed from the sheath at one end portion of the cable to the sheath in a state in which the conducting wires are bent toward the other end side of the cable and is formed larger than the cable hole, in which a portion of each of the conducting wires exposed from the sheath is disposed between an inner surface around the cable hole in the case and the conducting wire fixing member.

A sensor according to one or some exemplary embodiments of the invention includes the cable disconnection preventing structure, and an end portion of the conducting wire exposed from the sheath is connected thereto.

DESCRIPTION OF THE EMBODIMENTS

Figure 1A:
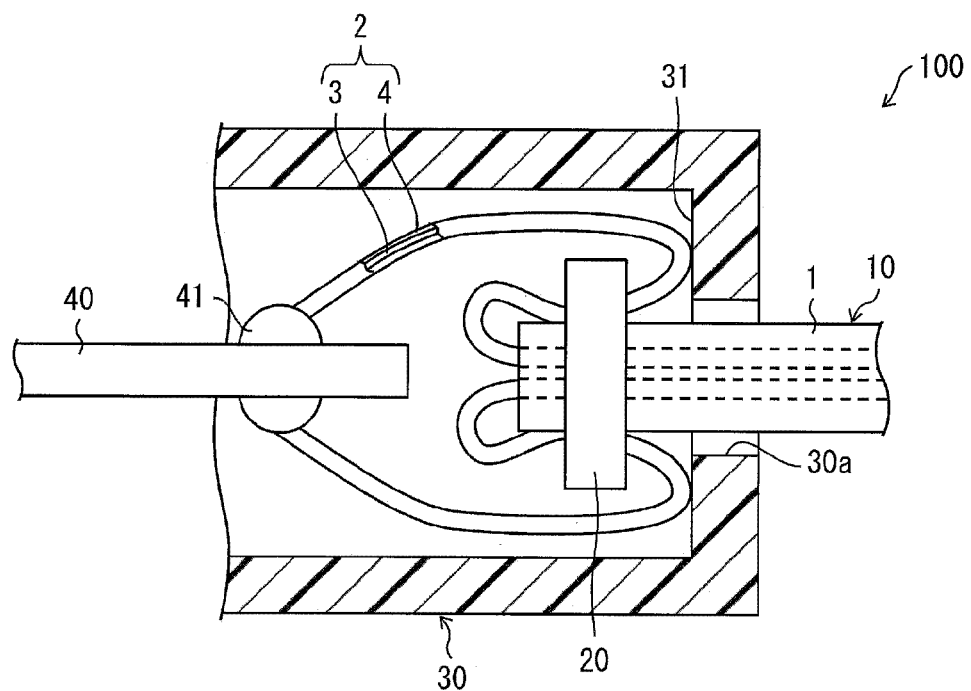
FIG. 1($a$) and FIG. 1($b$) schematically illustrate a structure and operation of a cable disconnection preventing structure according to one embodiment of the invention.

Provided is a cable disconnection preventing structure or the like in which a conducting wire is not cut at a connecting portion at which a distal end of the conducting wire is connected to a substrate or the like even when a cable is pulled.

A cable disconnection preventing structure according to one or some exemplary embodiments of the invention includes a case which has a cable hole through which a cable having a plurality of conducting wires covered with a sheath passes and in which one end portion of the cable is embedded, and a conducting wire fixing member which fixes the conducting wires exposed from the sheath at one end portion of the cable to the sheath in a state in which the conducting wires are bent toward the other end side of the cable and is formed larger than the cable hole, in which a portion of each of the conducting wires exposed from the sheath is disposed between an inner surface around the cable hole in the case and the conducting wire fixing member.

According to the above configuration, when the cable is pulled, since the conducting wire fixing member approaches the cable hole, portions of the conducting wires exposed from the sheath are sandwiched between the conducting wire fixing member and the inner surface of the case. Also, the conducting wires exposed from the sheath are fixed to the sheath by the conducting wire fixing member. As a result, a force pulling the cable does not act on the conducting wires before the sandwiched portion thereof. Therefore, it is possible to avoid cutting of the conducting wires at the connecting portion at which distal ends of the conducting wires are connected to a substrate or the like.

In the cable disconnection preventing structure, the conducting wire fixing member may fasten the conducting wires to the sheath.

According to the above configuration, the conducting wires can be fixed to the sheath with a simple structure.

In the cable disconnection preventing structure, the conducting wire fixing member may be a binding member made of a resin.

According to the above configuration, it is possible to configure the cable disconnection preventing structure at a low cost without using a special member.

In the cable disconnection preventing structure, the conducting wire fixing member may be a metal wire.

According to the above configuration, it is possible to configure the cable disconnection preventing structure at a low cost without using a special member.

In the cable disconnection preventing structure, the conducting wire fixing member may be integrally molded with the sheath.

According to the above configuration, it is possible to firmly fix the conducting wires to the sheath. Thereby, durability of the cable disconnection preventing structure can be improved.

A sensor according to one or some exemplary embodiments of the invention includes the cable disconnection preventing structure, and an end portion of a conducting wire exposed from a sheath is connected thereto.

According to the above configuration, even when the cable is pulled, it is possible to prevent the conducting wire from being cut at a connecting portion which is a portion at which the conducting wire is connected to the sensor. Thereby, reliability of the sensor can be improved.

According to one or some exemplary embodiments of the invention, a cable disconnection preventing structure or the like in which a conducting wire is not cut at a connecting portion at which a distal end of the conducting wire is connected to a substrate or the like even when a cable is pulled can be effectively provided.

Hereinafter, embodiments of the invention will be described with reference to FIGS. 1 to 4.

<Cable Disconnection Preventing Structure 100>

Figure 1B:
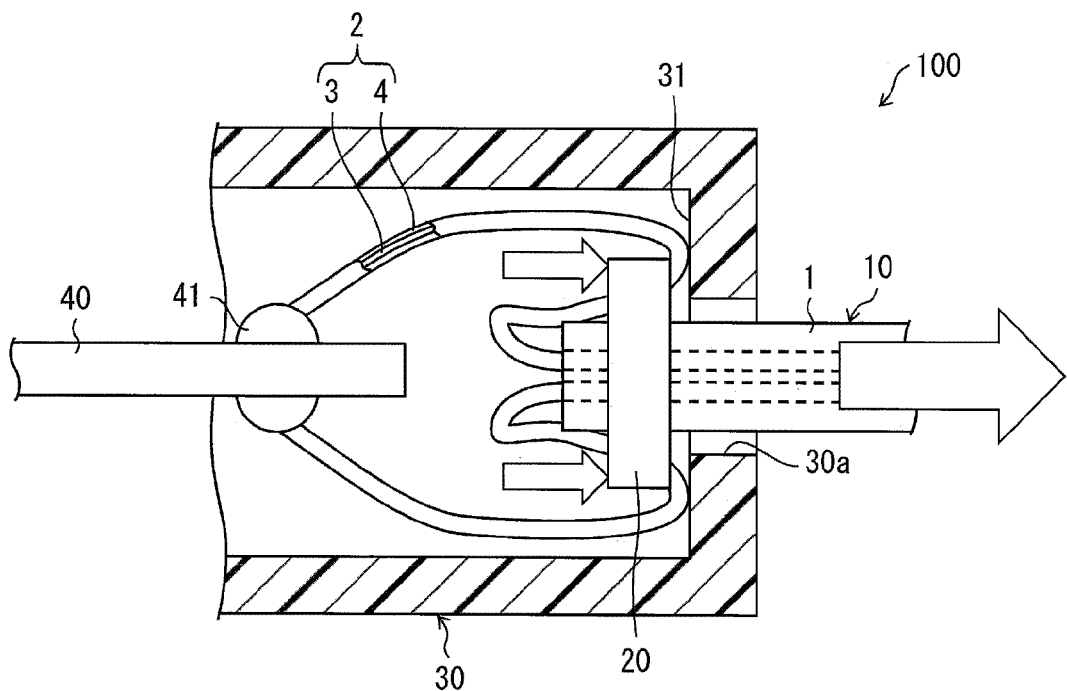
Figure 2:
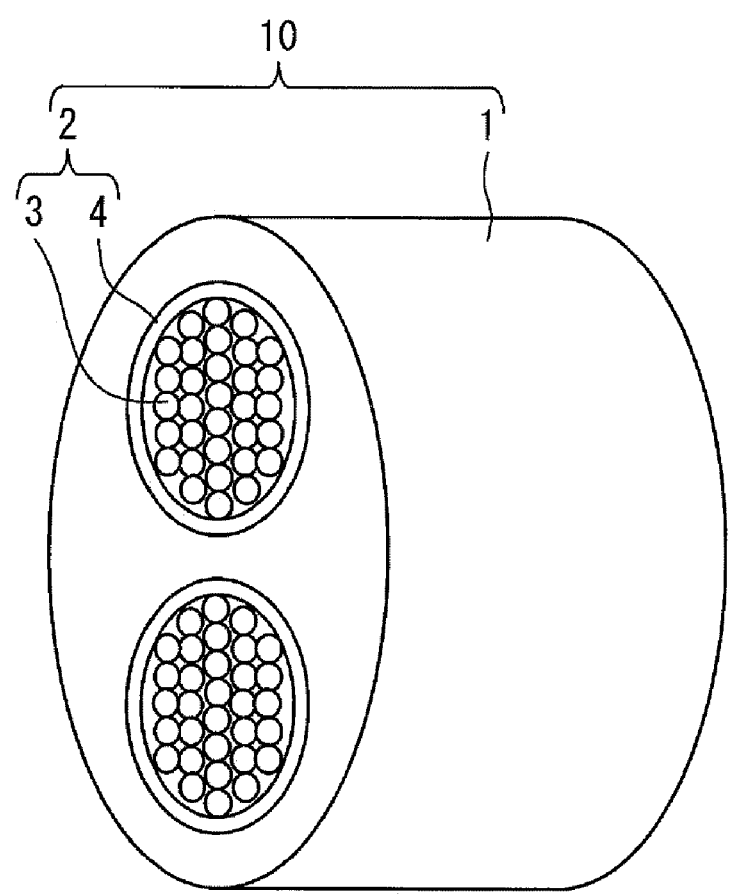
FIG. 2 is a cross-sectional view of a cable in the cable disconnection preventing structure according to one embodiment of the invention.

FIG. 1(a) and FIG. 1(b) schematically illustrate a structure and operation of a cable disconnection preventing structure 100 according to one embodiment of the invention. Here, FIG. 1(a) is a view illustrating the cable disconnection preventing structure 100 in a state in which a cable 10 is not pulled, and FIG. 1(b) is a view illustrating the cable disconnection preventing structure 100 in a state in which the cable 10 is pulled in a direction of an arrow. FIG. 2 is a cross-sectional view of the cable 10 in the cable disconnection preventing structure 100 according to one embodiment of the invention.

For convenience of description, members having the same functions as those described in this embodiment will be denoted by the same reference numerals, and description thereof will be omitted.

As illustrated in FIG. 1(a) and FIG. 1(b), a cable 10, a conducting wire fixing member 20, and a case 30 are provided in the cable disconnection preventing structure 100.

[Cable 10]

The cable 10 is a power cable which is electrically connected to a substrate 40.

As illustrated in FIG. 2, the cable 10 is configured with a conducting wire 2 and a sheath 1 which is a protective film of an insulating member covering a plurality of conducting wires 2. The conducting wire 2 is configured with conductors 3 and an insulator 4 which is an insulating member in which a plurality of conductors 3 are bundled and covered.

The conductors 3 transfer electric signals from an electronic component such as a sensor or the like connected to one end portion to the other end portion, and the insulator 4 covers outer peripheral surfaces of the plurality of conductors 3 for each bundle of the plurality of conductors 3 so that the bundles of conductors 3 bundled with the plurality of conductors 3 do not come into contact with each other.

As illustrated in FIG. 1(a), in this embodiment, one end portion of the cable 10 is embedded in the case 30, and a portion of the conducting wire 2 exposed from the sheath 1 at one end portion of the cable 10 is disposed between an inner surface 31 around a cable hole 30a in the case 30 and the conducting wire fixing member 20.

[Conducting Wire Fixing Member 20]

The conducting wire fixing member 20 fixes the conducting wire 2 to the sheath 1.

As illustrated in FIG. 1(a), the conducting wire fixing member 20 fixes the conducting wire 2 exposed from the sheath 1 at one end portion of the cable 10 to the sheath 1 in a state in which the conducting wire 2 is bent to the other end portion side of the cable 10.

As illustrated in FIG. 1(b), when the cable 10 is pulled in a direction of the arrow, the conducting wire fixing member 20 moves in the direction of the arrow and approaches the cable hole 30a. Here, since the conducting wire fixing member 20 is formed to be larger than the cable hole 30a, the conducting wire fixing member 20 does not come out of the cable hole 30a and stops in a form of pressing the conducting wire 2 against the inner surface 31 around the cable hole 30a in the case 30. As a result, a portion of the conducting wire 2 exposed from the sheath 1 is sandwiched between the conducting wire fixing member 20 and the inner surface 31 of the case 30. Also, the conducting wire 2 exposed from the sheath 1 is fixed to the sheath 1 by the conducting wire fixing member 20 as in FIG. 1(a). The effect of such a configuration will be described below by comparing it with a configuration of FIG. 3(a) and FIG. 3(b).

Figure 3A:
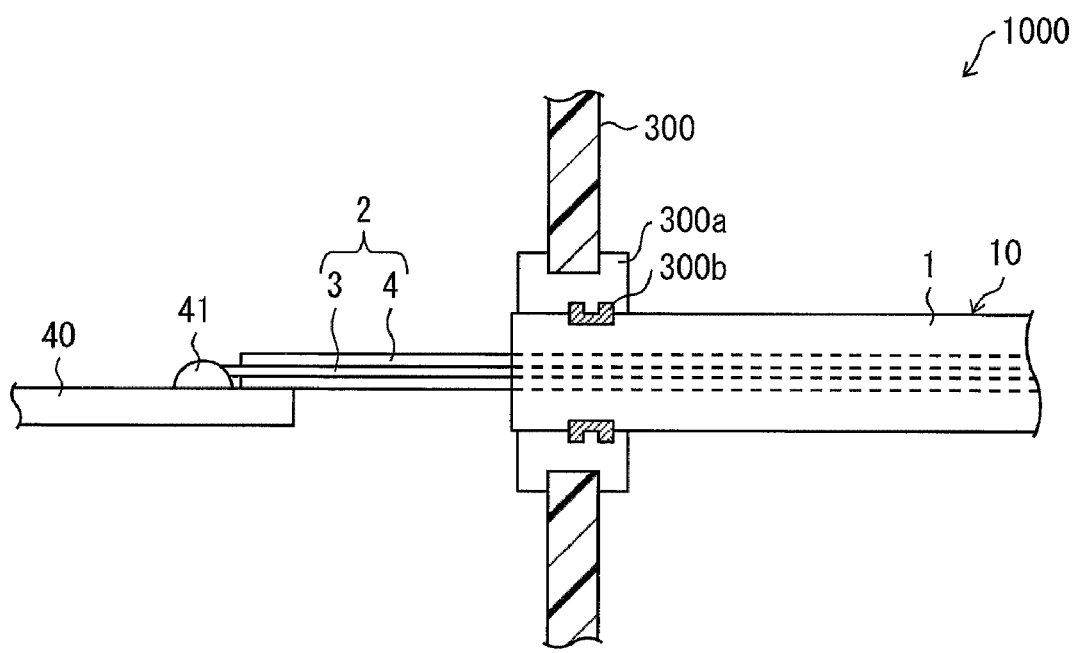
FIG. 3($a$) and FIG. 3($b$) schematically illustrate a structure and operation of a conventional cable disconnection preventing structure.
Figure 3B:
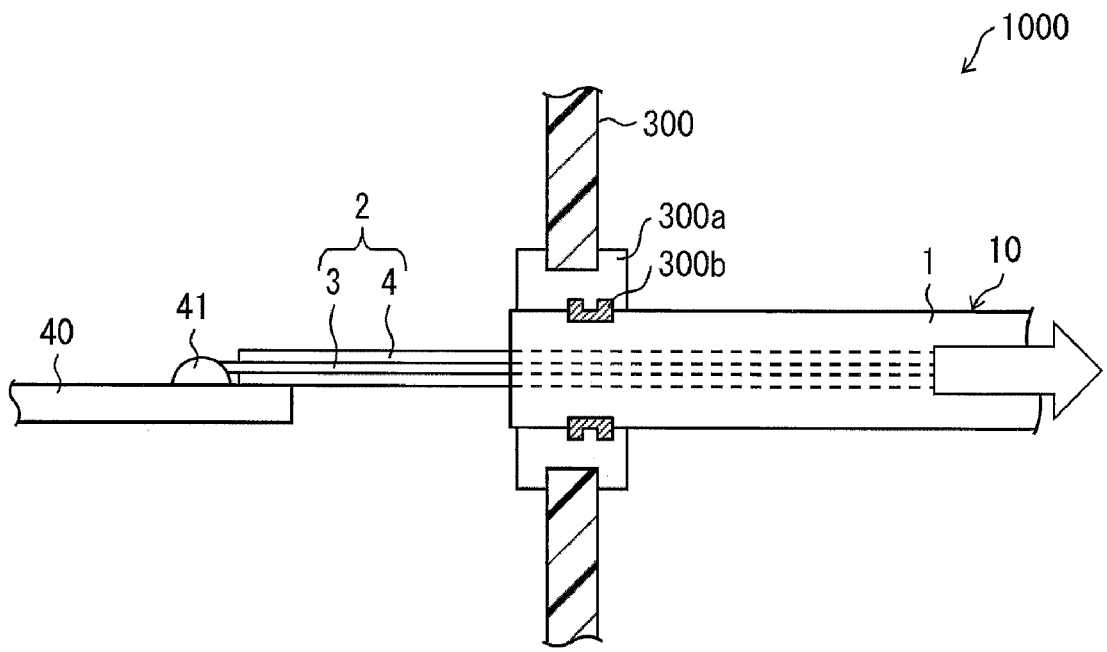

FIG. 3(a) and FIG. 3(b) is a view schematically illustrating a structure and operation of a conventional cable disconnection preventing structure 1000. As illustrated in FIG. 3(a), in the cable disconnection preventing structure 1000, only a portion of the sheath 1 of the cable 10 is fixed by a bushing 300a and a metal part 300b provided in a case 300, and the conducting wire 2 in the sheath 1 is not fixed. Therefore, as illustrated in FIG. 3(b), when the cable 10 is pulled in a direction of an arrow, the conducting wire 2 is also pulled together with the cable 10. As a result, the conducting wire 2 may be cut at a connecting portion 41 at which a distal end of the conducting wire 2 is connected to the substrate 40 or the like, and the conductors 3 in the conducting wires 2 come into contact with each other, resulting in a short circuit.

In contrast, in the present embodiment, as illustrated in FIG. 1(b), a force pulling the cable 10 is applied first to the conducting wire 2 at a portion sandwiched between the conducting wire fixing member 20 and the inner surface 31. That is, the force pulling the cable 10 does not act on the conducting wire 2 on the one end side connected to the substrate 40 or the like before acting on the conducting wire 2 of the sandwiched portion in the conducting wire 2. Therefore, even when the conducting wire 2 is assumed to be cut, it is cut at a portion covered with the insulator 4, and it is possible to avoid cutting of the conducting wire 2 at the connecting portion 41 at which the distal end of the conducting wire 2 is connected to the substrate 40 or the like. Thereby, it possible to avoid a short circuit caused by contact between the conductors 3 of the cut conducting wire 2.

In the present embodiment, since the conducting wire 2 is not simply fixed by resin sealing or the like but is indirectly fixed by being sandwiched between the conducting wire fixing member 20 and the inner surface 31 of the case 30, even when the cable 10 is pulled, the force is dispersed in the sandwiched portion of the conducting wire 2. Therefore, an excessive load is not applied to the sheath 1 as compared with the case in which the conducting wire 2 is resin-sealed. As a result, when the cable 10 is pulled, the sheath 1 cannot be cut before the conducting wire 2. That is, a tensile strength does not depend on a material of the sheath, and a high tensile strength proportional to a diameter of the conductor can be obtained.

As illustrated in FIG. 1(a) and FIG. 1(b), the conducting wire fixing member 20 fastens the conducting wire 2 to the sheath 1. Thereby, the conductor 2 can be fixed to the sheath 1 with a simple structure.

More specifically, the conducting wire fixing member 20 is an integrally molded body in which a binding member made of F a resin, a metal wire, and the sheath 1 are integrally molded. In addition, since the insulator 4 of the conducting wire 2 is not damaged, it may be a molded body in which the binding member made of a resin and the sheath 1 are integrally molded.

When the conducting wire fixing member 20 is a binding member made of a resin or a metal wire, it is possible to configure the cable disconnection preventing structure 100 at a low cost without using a special member.

Further, when the conducting wire fixing member 20 is a molded body molded integrally with the sheath 1, the conducting wire 2 can be firmly fixed to the sheath 1. Thereby, durability of the cable disconnection preventing structure 100 can be improved.

A resin constituting the binding member and a material constituting the molded body include at least one of a polyamide resin such as nylon 6 or nylon 66, a polypropylene resin, a fluoro resin, a polyetherether ketone (PEEK) resin, and the like. Further, a portion of the conducting wire fixing member 20 which comes in contact with the insulator 4 is rounded so as not to damage the insulator 4. When a resin constituting the binding member and a material constituting the molded body are the above-described resins, the insulator 4 cannot easily be damaged.

In addition, the metal wire includes at least one of copper and austenite-based stainless steel (SUS). When the metal wire includes such a metal, the conducting wire 2 can be firmly fixed to the sheath 1.

As illustrated in FIG. 1(a) and FIG. 1(b), as long as an outer diameter of the conducting wire fixing member 20 is larger than the cable hole 30a of the case 30, an arbitrary size can be selected according to the size of the case 30. For example, when a small binding member made of a resin such as Insulock (registered trademark) is used as the conducting wire fixing member 20, the outer diameter of the conducting wire fixing member 20 may be 10 mm or more and 12 mm or less. Thereby, the conducting wire 2 can be indirectly fixed by being sandwiched between the conducting wire fixing member 20 and the inner surface 31 of the case 30.

[Case 30]

The case 30 is one in which one end portion of the cable 10 is embedded.

As illustrated in FIG. 1(a), the case 30 includes the cable hole 30a through which the cable 10 passes and the inner surface 31.

An outer diameter of the cable hole 30a can be arbitrarily designed as long as it is larger than an outer diameter of the cable 10 and smaller than the outer diameter of the conducting wire fixing member 20.

In the present embodiment, the conducting wire fixing member 20 and the substrate 40 are embedded in the case 30 in addition to one end portion of the cable 10. For example, when the cable disconnection preventing structure 100 according to the present embodiment is provided in a photoelectric sensor or the like, the housing may further include electronic components such as a light emitting device, a light receiving device, a power source integrated circuit (IC), and the like.

(Substrate 40)

The substrate 40 is electrically connected to the cable 10 via the connecting portion 41, and for example, may be a circuit substrate or the like used for a drive circuit or the like used for a photoelectric sensor or the like.

Here, the connecting portion 41 indicates a portion connected to the substrate 40, for example, by melting a portion of the conductor 3 with solder or the like, but as long as the conductor 3 and the substrate 40 can be connected, an arbitrary form such as a connector, a flexible printed circuit (FPC), EPC, or the like can be employed.

In FIG. 1(a) and FIG. 1(b), the substrate 40 is disposed so that a surface of the substrate 40 is parallel to a direction in which the cable 10 is pulled, but the present embodiment is not limited to such a form. In the present embodiment, other portions can be arbitrarily designed as long as the conducting wire 2 is sandwiched and fixed between the inner surface 31 of the case 30 and the conducting wire fixing member 20 when the cable 10 is pulled. For example, the substrate 40 on a side opposite to the side in which the conducting wire 2 is sandwiched may be disposed in a direction perpendicular to the direction in which the cable 10 is pulled. As described above, the cable disconnection preventing structure 100 according to the present embodiment has a high degree of freedom in design.

<Sensor 200>

Figure 4:
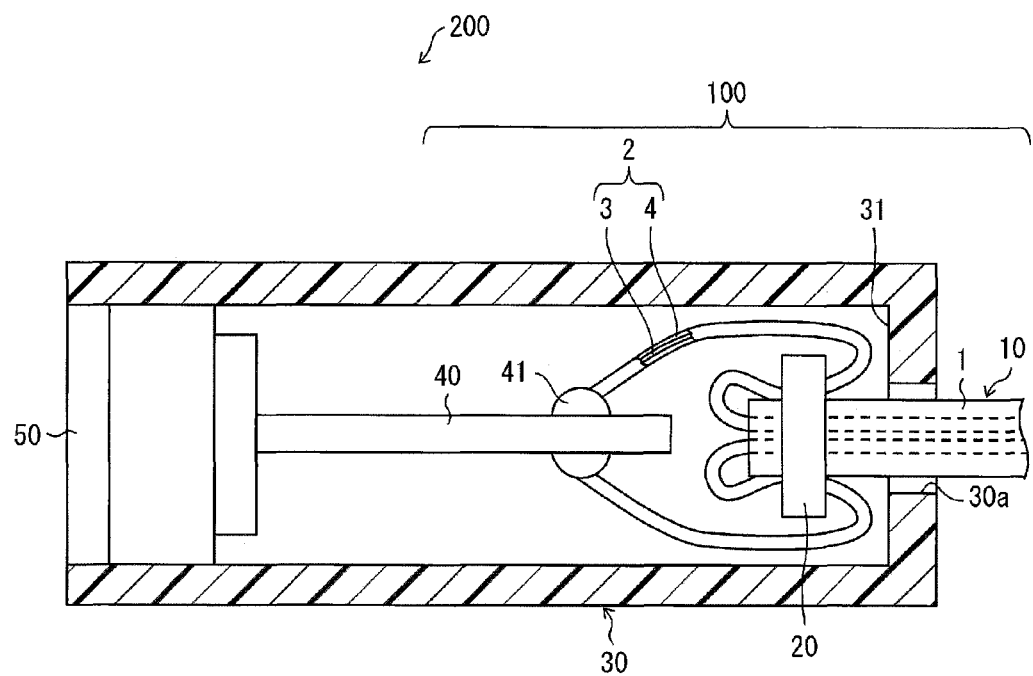
FIG. 4 is a view schematically illustrating a sensor according to one embodiment of the invention.

FIG. 4 is a view schematically illustrating a sensor 200 according to one embodiment of the invention.

As illustrated in FIG. 4, the cable disconnection preventing structure 100 according to the present embodiment can be appropriately provided in the sensor 200.

Here, the sensor 200 illustrated in FIG. 4 illustrates an example in which the sensor 200 is configured as a photoelectric sensor, and includes a lens 50. Lenses such as a light emitting lens and a light receiving lens are provided in this lens 50. Although not illustrated, a light emitting portion and a light receiving portion are provided to correspond to the light emitting lens and the light receiving lens, and these are electrically connected to a circuit provided on the substrate 40. As described above, the cable disconnection preventing structure 100 according to the present embodiment can be applied to the sensor 200 as a photoelectric sensor. However, the sensor 200 is not limited to the photoelectric sensor and may be an arbitrary sensor as long as the end portion of the conducting wire 2 exposed from the sheath 1 is connected thereto. For example, the sensor 200 can also be used as a proximity sensor.

As described above, when the sensor 200 includes the cable disconnection preventing structure 100, even when the cable 10 is pulled, it is possible to prevent the conducting wire 2 from being cut at the connecting portion which is a portion at which the conducting wire 2 is connected to the sensor 200. Thereby, reliability of the sensor 200 can be improved.

In the example described above, the sensor 200 is given as an example of something in which the cable disconnection preventing structure 100 is provided, but the present embodiment is not limited thereto. The cable disconnection preventing structure 100 according to the present embodiment can be appropriately used for ropes, optical fibers, electric wires, and the like, for example.

ADDITIONAL NOTES

The invention is not limited to the above-described embodiments, but various modifications are possible within the scope indicated in the claims, and embodiments obtained by appropriately combining technical methods disclosed in different embodiments are also included in the technical scope of the invention.

What is claimed is:

1. A cable disconnection preventing structure comprising:
   a case which has a cable hole through which a cable having a plurality of conducting wires covered with a sheath passes and in which one end portion of the cable is embedded; and
   a conducting wire fixing member which fixes only the conducting wires exposed from the sheath at the one end portion of the cable to the sheath in a state in which the conducting wires are bent toward the other end portion side of the cable and is formed larger than the cable hole, wherein
   a portion of each of the conducting wires exposed from the sheath is disposed between an inner surface around the cable hole in the case and the conducting wire fixing member.

2. The cable disconnection preventing structure according to claim 1, wherein the conducting wire fixing member fastens the conducting wires to the sheath.

3. The cable disconnection preventing structure according to claim 2, wherein the conducting wire fixing member is a binding member made of a resin.

4. The cable disconnection preventing structure according to claim 2, wherein the conducting wire fixing member is a metal wire.

5. The cable disconnection preventing structure according to claim 1, wherein the conducting wire fixing member is integrally molded with the sheath.

6. A sensor comprising the cable disconnection preventing structure according to claim 1, to which an end portion of the conducting wire exposed from the sheath is connected.

7. A sensor comprising the cable disconnection preventing structure according to claim 2, to which an end portion of the conducting wire exposed from the sheath is connected.

8. A sensor comprising the cable disconnection preventing structure according to claim 3, to which an end portion of the conducting wire exposed from the sheath is connected.

9. A sensor comprising the cable disconnection preventing structure according to claim 4, to which an end portion of the conducting wire exposed from the sheath is connected.

10. A sensor comprising the cable disconnection preventing structure according to claim 5, to which an end portion of the conducting wire exposed from the sheath is connected.

* * * * *